(12) United States Patent
Johnson et al.

(10) Patent No.: US 7,649,388 B2
(45) Date of Patent: Jan. 19, 2010

(54) ANALOG VOLTAGE RECOVERY CIRCUIT

(75) Inventors: Luke A. Johnson, Queen Creek, AZ (US); Yueming He, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 495 days.

(21) Appl. No.: 11/396,067

(22) Filed: Mar. 31, 2006

(65) Prior Publication Data

US 2007/0229113 A1 Oct. 4, 2007

(51) Int. Cl.
*H03L 7/06* (2006.01)
(52) U.S. Cl. .................. 327/156; 327/94; 327/530; 327/147
(58) Field of Classification Search ......... 327/156–159, 327/147–149, 94, 337, 554, 530
See application file for complete search history.

(56) References Cited

U.S. PATENT DOCUMENTS

| | | | |
|---|---|---|---|
| 5,142,821 A * | 9/1992 | Bell | ............................... 47/76 |
| 5,760,657 A | 6/1998 | Johnson | |
| 5,784,320 A | 7/1998 | Johnson | |
| 5,994,939 A | 11/1999 | Johnson | |
| 6,075,476 A | 6/2000 | Johnson et al. | |
| 6,081,162 A | 6/2000 | Johnson | |
| 6,144,195 A | 11/2000 | Afghahi et al. | |
| 6,163,582 A | 12/2000 | Johnson | |
| 6,184,732 B1 | 2/2001 | Johnson et al. | |
| 6,194,967 B1 | 2/2001 | Johnson et al. | |
| 6,208,181 B1 | 3/2001 | Johnson | |
| 6,232,757 B1 | 5/2001 | Afghahi et al. | |
| 6,232,826 B1 | 5/2001 | Afghahi et al. | |
| 6,249,159 B1 | 6/2001 | Johnson | |
| 6,255,873 B1 | 7/2001 | Johnson et al. | |
| 6,288,666 B1 | 9/2001 | Afghahi et al. | |
| 6,310,514 B1 | 10/2001 | Johnson | |
| 6,342,848 B1 | 1/2002 | Johnson et al. | |
| 6,362,666 B1 | 3/2002 | Afghahi et al. | |
| 6,417,675 B1 | 7/2002 | Johnson | |
| 6,496,046 B2 | 12/2002 | Johnson | |
| 6,498,824 B1 | 12/2002 | Johnson | |
| 6,518,806 B2 | 2/2003 | Johnson | |
| 6,731,688 B1 | 5/2004 | Johnson | |
| 6,798,612 B2 | 9/2004 | Smith | |
| 7,026,975 B1 * | 4/2006 | Steward et al. | ............... 341/161 |
| 7,046,046 B2 * | 5/2006 | Temes et al. | ................... 327/91 |
| 7,197,098 B2 | 3/2007 | Johnson | |

(Continued)

*Primary Examiner*—Dinh T. Le
(74) *Attorney, Agent, or Firm*—Schwegman, Lundberg & Woessner, P.A.

(57) ABSTRACT

In an embodiment, an analog voltage recovery circuit comprising a plurality of capacitors having first terminals connected to a node having the analog voltage, and comprising a state machine, where during an operating mode the second terminals of the plurality of capacitors are coupled to a first rail, and where during a digitization mode the state machine couples the second terminals of a set of the plurality of capacitors to a second rail so that the analog voltage is closer to the second rail voltage than during the beginning of the digitization mode. In an embodiment, the analog voltage recovery circuit brings the node voltage to the second rail voltage at the end of the digitization mode, and then floats the node and couples the second terminals of the plurality of capacitors to the first rail to approximately restore the analog voltage. Other embodiments are described and claimed.

22 Claims, 5 Drawing Sheets

U.S. PATENT DOCUMENTS

| | | |
|---|---|---|
| 7,280,456 B2 | 10/2007 | Brown et al. |
| 7,302,246 B2 | 11/2007 | Tseng et al. |
| 7,330,993 B2 | 2/2008 | Deshmane et al. |
| 2005/0146385 A1 | 7/2005 | Johnson et al. |

* cited by examiner

ANALOG VOLTAGE RECOVERY CIRCUIT

FIELD

Embodiments relate to analog circuits, and more particularly, to analog circuits to recover an analog voltage.

BACKGROUND

One approach to reduce power consumption in a circuit is to turn OFF various circuit blocks within the circuit when they are not needed for proper operation of the circuit, and then to turn them back ON when they are needed. However, many analog circuit blocks, such as for example a phase-locked loop (PLL), take a relatively large amount of time to reach their steady state operation. For such analog circuit blocks, it is desirable to store their steady state if they are switched OFF, so that they may quickly reach their steady state operation when turned back ON. In many practical instances, the steady state of an analog circuit may be represented by one or more analog voltages.

It is useful to provide an analog recovery circuit to allow the recovery of one or more analog voltages.

DESCRIPTION OF EMBODIMENTS

Embodiments of the present invention may be termed analog recovery circuits. In an embodiment, an analog voltage at some time is represented by a set of binary voltages (a binary number), the binary voltages (or binary number) is stored, and the set of binary voltages is used at a later time to recover, or reconstruct, the analog voltage. The recovery, or reconstruction, of the analog voltage is in general only approximate, as is the case for any scheme in which an arbitrary analog voltage is represented by a finite set of bits.

Embodiments are expected to have several useful characteristics, such as economical utilization of die area and built-in compensation due to voltage or temperature offsets. In some applications, embodiments may have other useful characteristics. For example, in applications to a PLL, an embodiment analog recovery circuit may share components with the PLL. Furthermore, in applications to a PLL, a synchronizer for the voltage-controlled-oscillator (VCO) may be used to improve lock time upon restart of the PLL by establishing an a priori phase relationship for the VOC, where the a priori phase relationship is the phase relationship at an earlier time, recovered by an embodiment analog recovery circuit.

Figure 1:
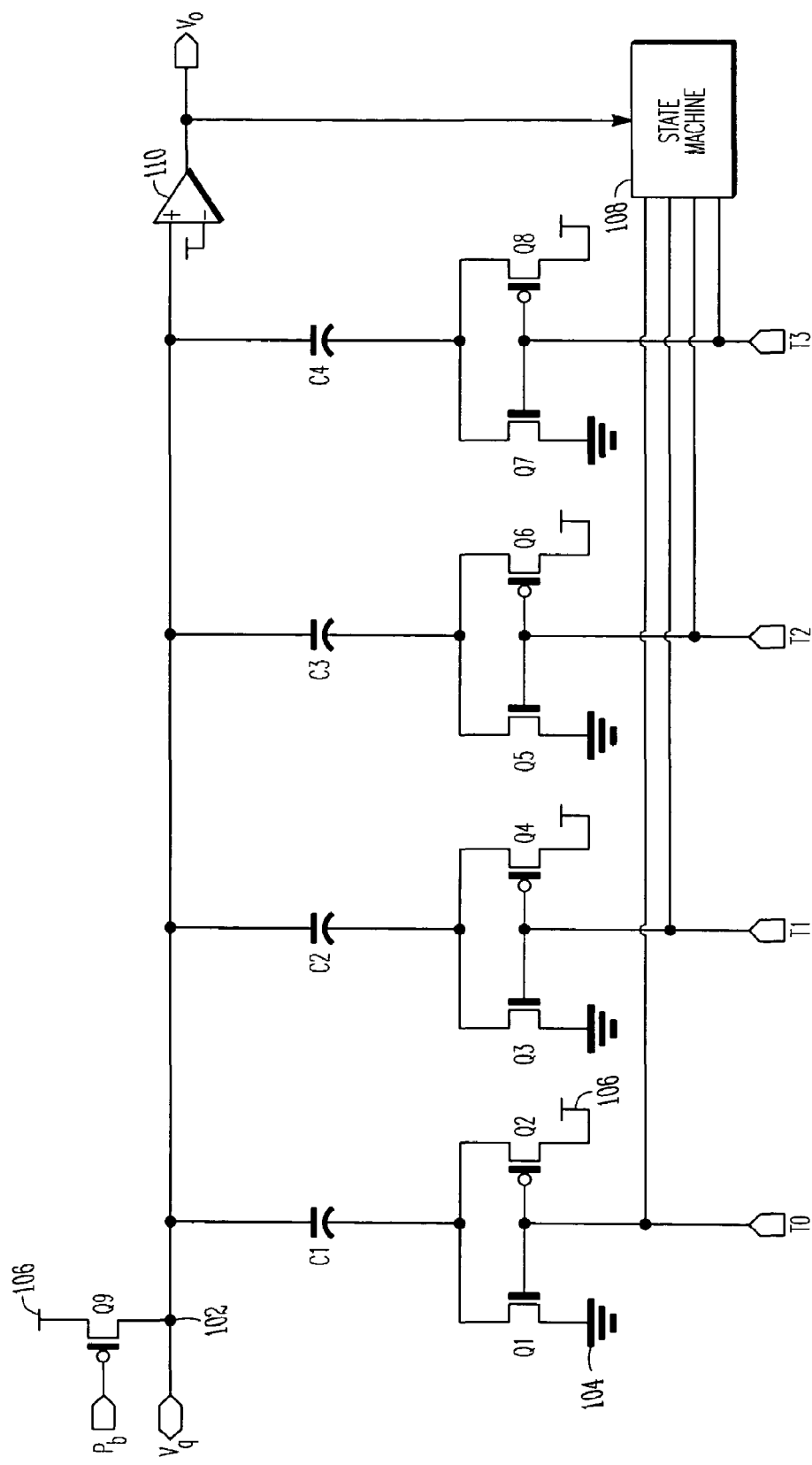
FIG. 1 illustrates an embodiment voltage recovery circuit.

An embodiment of the present invention employing four capacitors to recover an analog voltage is illustrated in FIG. 1, where an analog voltage at node 102 is denoted by Vq. Although any number of capacitors may be employed, for ease of discussion, the embodiment of FIG. 1 is chosen to have four capacitors. The top terminals (or plates) of capacitors C1, C2, C3, and C4 are connected to node 102. The bottom terminals of these capacitors may be coupled to either ground rail 104 or to voltage reference supply 106, depending upon the states of transistors Q1 through Q8. Voltage reference supply 106 could be a power rail providing Vcc, but other reference voltages may be used. In practice, the reference voltage should be chosen such that it is greater than the maximum of Vq. For ease of discussion, we let Vref denote the voltage of voltage reference supply 106, where for some embodiments, Vref=Vcc.

When the analog circuit providing the voltage Vq is ON, the voltages T0, T1, T2, and T3 are HIGH so that the bottom terminals of capacitors C1, C2, C3, and C4 are coupled to ground rail 104, and pMOSFET (p-Metal-Oxide-Semiconductor-Field-Effect-Transistor) Q9 is OFF. The terms "top terminals" and "bottom terminals" are merely used for convenience, it being understood that in practice the terminals of a capacitor are not necessarily related to each other in which one terminal is above the other. What is meant here is that the top terminal of a capacitor is that terminal connected to the analog voltage node, and the bottom terminal is that terminal which is capable of being coupled to either a ground rail or a power rail, or other reference voltage.

When the analog circuit providing the voltage Vq is put into a standby mode, e.g., switched OFF, it does not drive node 102. That is, node 102 is floating but for the circuit of FIG. 1. It is assumed that the analog circuit provides a capacitive impedance between node 102 and ground rail 104 sufficiently large so that the voltage at node 102 remains relatively static when the analog circuit is put into standby mode.

Figure 2:
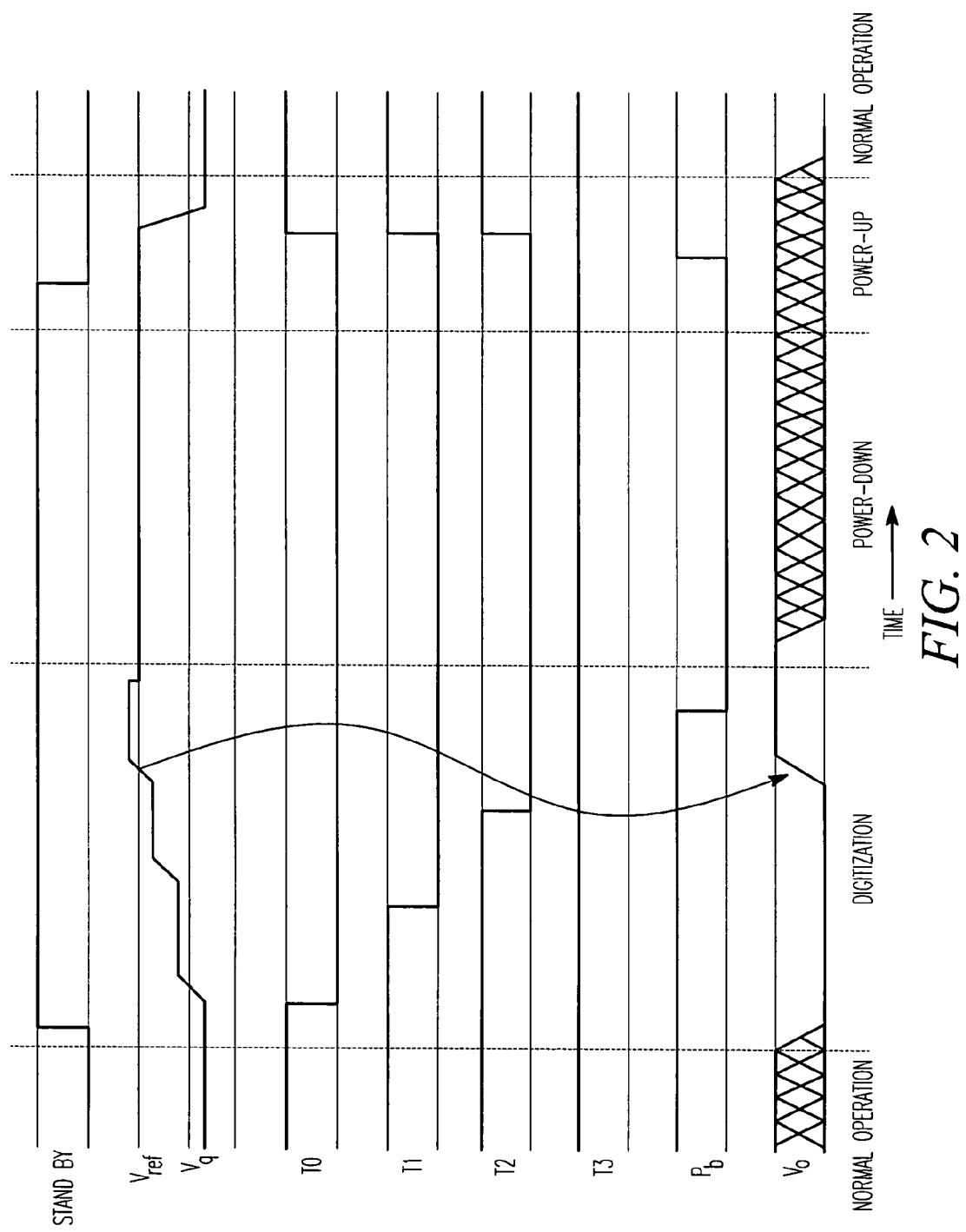
FIG. 2 illustrates example modes of operation for the circuit of FIG. 1.

When the analog circuit is put into its standby mode, a process begins under control of state machine 108. This process may be described with respect to the example of FIG. 2. In FIG. 2, the various voltages Vq, T0, T1, T2, T3, and Pb are indicated. Furthermore, the voltage V0 in FIG. 2 denotes the output voltage of comparator 110. The x-axis in FIG. 2 denotes time.

In the example of FIG. 2, state machine 108 controls the voltages T0, T1, T2, and T3 as indicated. During the digitization time period indicated in FIG. 2, the voltage T0 is brought from HIGH to LOW so that the bottom terminal of capacitor C1 is coupled to voltage reference supply 106. Coupling the bottom terminal of capacitor C1 to voltage reference supply 106 increases the voltage Vq. The increase in voltage Vq depends upon, among other parameters, the ratio of the capacitance of capacitor C1 to that of the capacitance provided by the analog circuit. If the latter quantity is denoted as C, and if the label C1 is used to denote the capacitance of capacitor C1, then the increase in the voltage Vq is, for ideal capacitors, given by Vref/(1+C/C1).

After the voltage T0 is brought from HIGH to LOW and Vq has time to settle to its new steady state value, state machine 108 brings the voltage T1 from HIGH to LOW so that the bottom terminal of capacitor C2 is now coupled to voltage reference supply 106. The voltage Vq rises again.

The above process continues, with successive capacitors having their bottom terminals coupled to voltage reference supply 106 until the voltage Vq rises above Vref. When Vq rises above Vref, comparator 110 changes its output voltage to indicate that Vq is now greater than Vref. This cause and effect is illustrated by the arrow in FIG. 2, where the tail end of the arrow is the event where Vq rises above Vref, and the head of the arrow is the event where comparator 110 causes Vo to change. This triggers state machine 108 to stop the process whereby successive capacitors are switched to have their bottom terminals coupled to voltage reference supply 106. In the particular example of FIG. 2, Vq rises above Vref due to the voltage T2 being switched from HIGH to LOW. Consequently, in this particular example, Vo goes HIGH and the digitization process ends without voltage T3 being switched from HIGH to LOW.

In the example of FIG. 2, the digitization process has encoded the initial voltage Vq at node 102 as the voltage signals T0=LOW, T1=LOW, T2=LOW, and T3=HIGH. From the embodiment of FIG. 1, it is seen that there are four possible final states for the four voltages T0, T1, T2, and T3; namely, (LOW, HIGH, HIGH, HIGH), (LOW, LOW, HIGH, HIGH), (LOW, LOW, LOW, HIGH), and (LOW, LOW, LOW, LOW). Consequently, the embodiment of FIG. 1 represents a 2-bit encoding (or representation) of the analog voltage Vq.

After the completion of the digitization process, but before the analog circuit is powered back ON, the voltage at the gate of pMOSFET Q9, denoted as Pb in FIGS. 1 and 2, is switched from HIGH to LOW so that pMOSFET Q9 is ON. In the example of FIG. 2, this occurs when the voltage V0 is brought HIGH. During power-down of the analog circuit, when the digitization process has completed, the voltages T0, T1, T2, and T3 are maintained during power-down. Maintaining these voltages is straight forward because they are either HIGH or LOW, so that conventional logic circuits may be employed.

With pMOSFET Q9 switched ON, the voltage Vq is brought to Vref. When the analog circuit is powered up, pMOSFET Q9 is switched OFF, and state machine 108 restores the original voltage Vq by switching voltages T0, T1, and T2 to HIGH. That is, all those capacitors whose bottom terminals were coupled to voltage reference supply 106 are now switched so that their bottom terminals are now coupled to ground rail 104. Because the voltage Vq was brought to Vref after digitization but before power up, this process, in a sense, reverses the digitization process. The result is that Vq is brought down to its original value when the digitization process began. However, this statement is not quite accurate because the voltage Vq, in general, is restored only approximately to its original value. This is because, when the output voltage at comparator 110 switches from LOW to HIGH during the digitization process, the voltage Vq will most likely be larger than Vref, and only rarely will it happen to equal Vref. This approximation may be improved by utilizing more capacitors, so that a larger bit-representation of Vq is developed.

Figure 3:
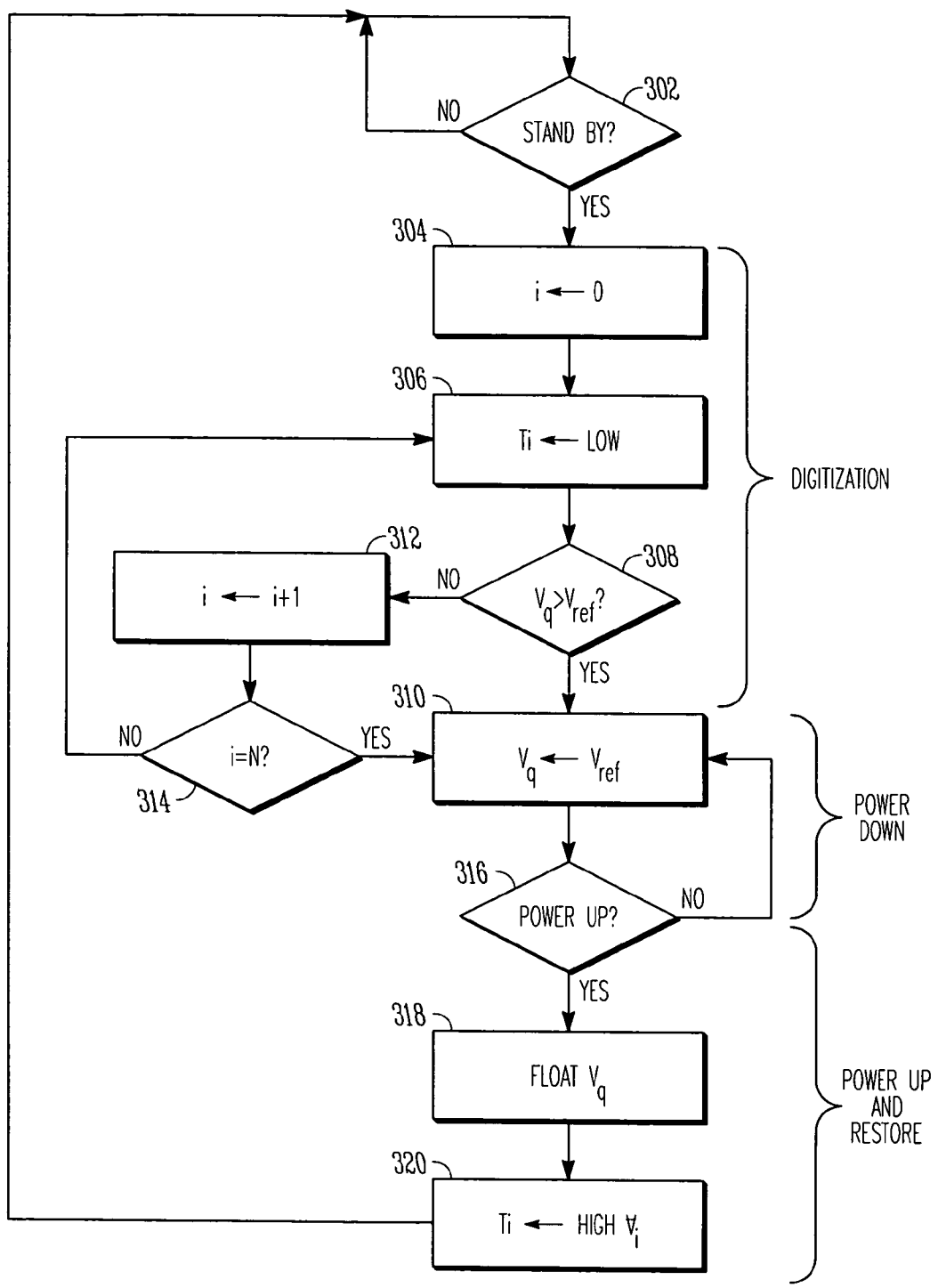
FIG. 3 illustrates an example process for an embodiment voltage recovery circuit.

The process described with respect to FIGS. 1 and 2 may be represented by the flow diagram of FIG. 3. When the analog circuit leaves the standby mode in process 302, an index i is initialized to 0 in process 304. In process 306, the voltage $T_i$ is switched to LOW so that the bottom terminal of the corresponding capacitor is coupled to the voltage reference supply Vref. In process 308, a determination is made as to whether Vq>Vref. If this relationship is true, then control is brought to process 310 whereby Vq is brought to Vref, otherwise, control is brought to process 312 whereby the index i is incremented by one. In process 314, the index i is tested to see if it is equal to the integer N, where N−1 is the number of capacitors used to encode Vq. If i=N, then control is brought to process 310. Otherwise, control is brought back to process 306. Processes 304 through 314 comprise the digitization process, as indicated in FIG. 3.

Process 316 determines whether the analog circuit is to be powered up. If it is, then control is brought to process 318 in which the Vq node is floated. Processes 310 and 316 may be viewed as a power-down mode, whereas entering process 318 begins the power-up and restore mode. After Vq is floated in process 318, in process 320 the voltages $T_i$ for each i are switched to HIGH if they are not already HIGH. Control is then brought back to standby mode 302.

In some embodiments, the values of the capacitors used to encode the voltage Vq may be equal to each other. In other embodiments, they may not be equal to each other. Furthermore, in some embodiments, the process by which digitization is carried out may vary. For example, another embodiment may be described as follows. Suppose the values of the capacitors are chosen to be unequal. One particular example is to choose them to be related to each other by powers of 2, which is the binary weighted case. Then, when digitization begins, the largest capacitor is switched to have its bottom terminal coupled to voltage reference supply 106. If the voltage Vq does not exceed Vref, then the next largest capacitor is switched to have its bottom terminal coupled to voltage reference supply 106. This process continues, switching the capacitors in decreasing order of their capacitances, until either a capacitor is switched for which Vq exceeds Vref, or there are no more capacitors left to switch. If some capacitor is switched for which Vq exceeds Vref, then that capacitor is switched again so that its bottom terminal is again coupled to ground rail 104, and the process again continues whereby the next largest capacitor relative to that capacitor is switched. This process is illustrated in FIG. 4.

Figure 4:
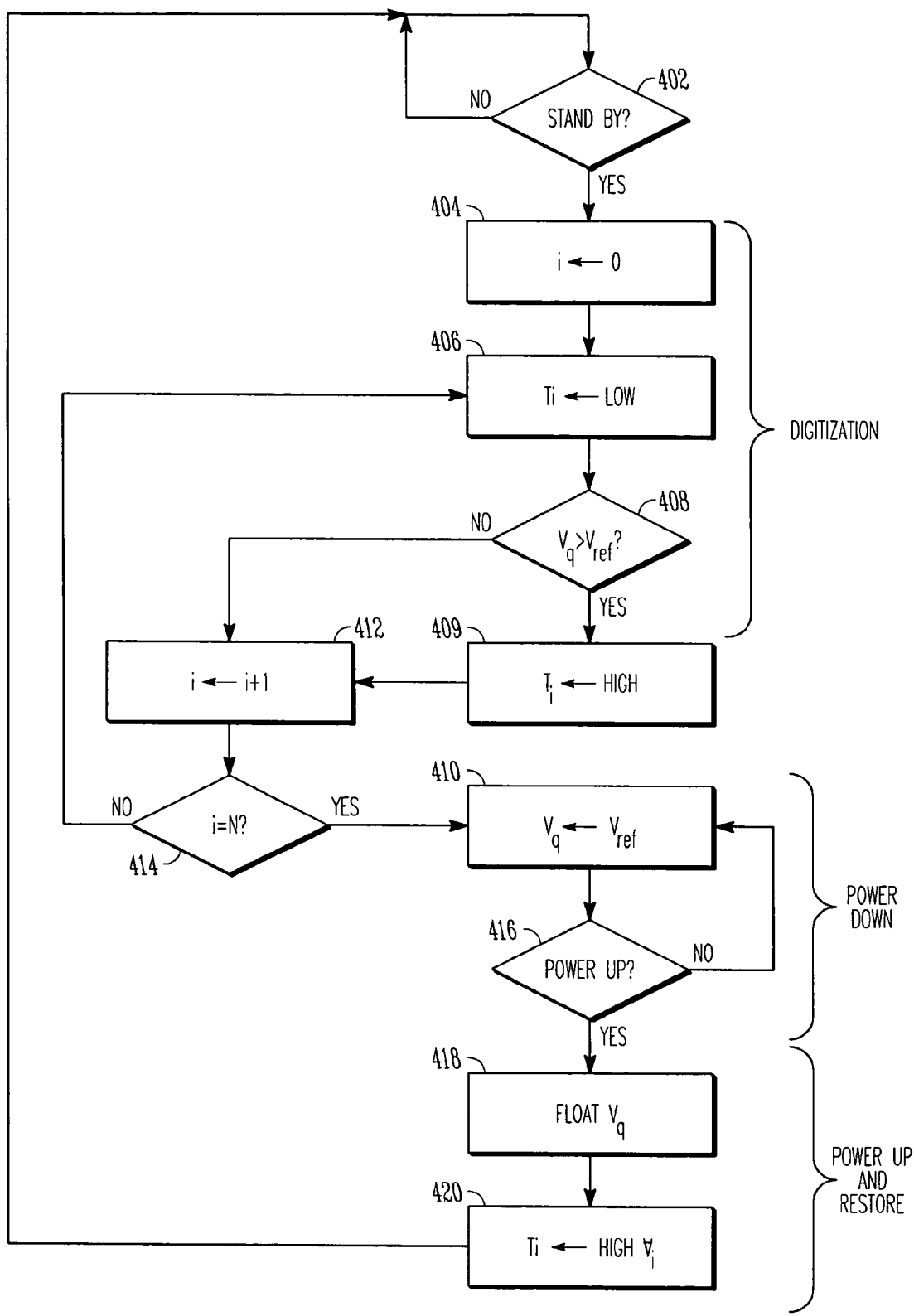
FIG. 4 illustrates another example process for an embodiment voltage recovery circuit.

Referring to FIG. 4, processes 402 through 420, with the exception of process 409, correspond to processes 302 through 320 in FIG. 3, and their descriptions need not be repeated. However, whereas the end of the digitization process is reached in FIG. 3 when in process 308 a determination is made that Vq is greater than Vref, the end of the digitization process in FIG. 4 is not necessarily reached when that same determination is made in process 408. If in process 408 it is determined that Vq is greater than Vref, then in process 409 the voltage $T_i$ for the current index i is switched back to HIGH. Control is then brought to process 412 where the index i is incremented by one so that next capacitor is switched to have its bottom terminal brought to Vref, assuming that there is a next capacitor. It is assumed that the capacitors corresponding to the voltages $T_i$ have decreasing capacitance for increasing i.

A useful feature of an embodiment when used in conjunction with a PLL is that the capacitors used to quantize the analog voltage during the digitization process may also comprise the tank capacitor used in a loop filter in the PLL. This results in saving die area.

Another useful feature is that the analog voltage may be (approximately) restored if the digitization operation is interrupted. This is accomplished by simply coupling the bottom terminals of the capacitors back to ground rail 104.

It should be appreciated that transistors used to switch the capacitors, e.g. transistors Q1 through Q8 in FIG. 1, may be replaced by more sophisticated switches. For example, double isolated switches may be employed.

It is expected that errors due to mismatches in the capacitors used in the digitization process, or other time-invariant non-linearities in the capacitors, as well as temperature induced offsets, are significantly cancelled out because the same capacitors are used to both encode (quantize) the voltage Vq and to restore the voltage Vq.

Embodiments of the present invention may find applications to a wide range of electronic systems. For example, in FIG. 5, a simplified system level view of a computer system is illustrated, where an embodiment analog recovery circuit 502 is coupled to PLL 504 in microprocessor 506. Other components in the system of FIG. 5 include, for example, system memory 508 and chipset 510. An embodiment analog recovery circuit may also be employed in chipset 510, as well as other components in the system of FIG. 5.

Figure 5:
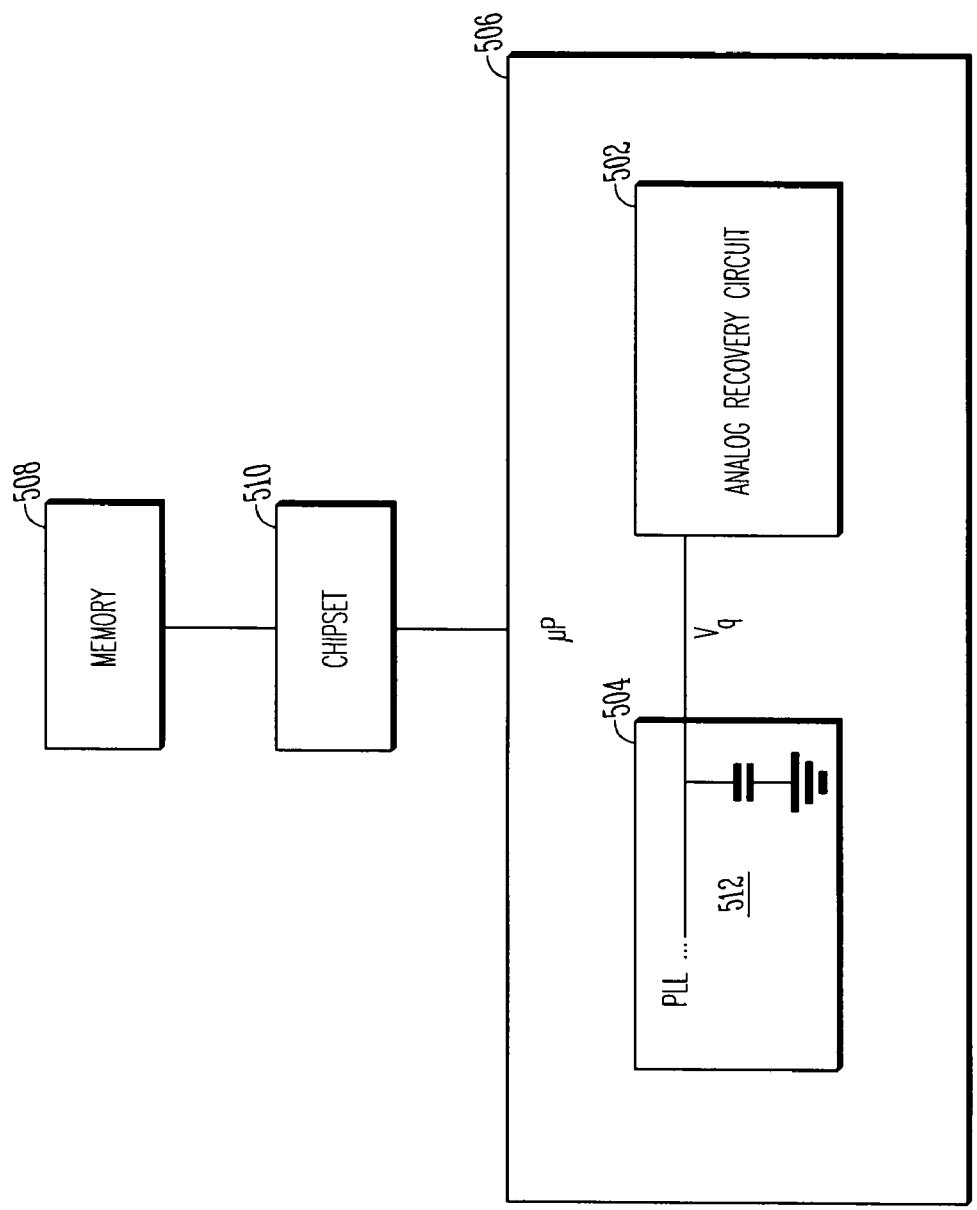
FIG. 5 illustrates a computer system employing an embodiment voltage recovery circuit with a phase-locked loop.

In FIG. 5, tank capacitor 512 has a voltage Vq. When PLL 504 is to be powered down, analog recovery circuit 502 represents, or encodes, the voltage Vq during a digitalization process as described previously. When PLL 504 is powered up, the voltage Vq is restored as described previously. The capacitors used in analog recovery circuit 502 may serve as capacitor 512 in PLL 504.

Various modifications may be made to the disclosed embodiments without departing from the scope of the invention as claimed below. For example, in some embodiments, the roles of the voltage reference supply and the ground rail may be reversed. Accordingly, for some embodiments, the bottom terminals of the capacitors are coupled to the voltage reference supply during normal operation of the analog circuit, and are then switched to the ground rail during the digitization process.

It is to be understood in these letters patent that the meaning of "A is connected to B", where A or B may be, for example, a node or device terminal, is that A and B are connected to each other so that the voltage potentials of A and B are substantially equal to each other. For example, A and B may be connected by way of an interconnect, for example. In integrated circuit technology, the interconnect may be exceedingly short, comparable to the device dimension itself. For example, the gates of two transistors may be connected to each other by polysilicon or copper interconnect that is comparable to the gate length of the transistors. As another example, A and B may be connected to each other by a switch, such as a transmission gate, so that their respective voltage potentials are substantially equal to each other when the switch is ON.

It is also to be understood in these letters patent that the meaning of "A is coupled to B" is that either A and B are connected to each other as described above, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element which in turn is connected to B.

It is also to be understood in these letters patent that a "current source" may mean either a current source or a current sink. Similar remarks apply to similar phrases, such as, "to source current".

It is also to be understood in these letters patent that various circuit blocks, such as current mirrors, amplifiers, etc., may include switches so as to be switched in or out of a larger circuit, and yet such circuit blocks may still be considered connected to the larger circuit because the various switches may be considered as included in the circuit block.

Various mathematical relationships may be used to describe relationships among one or more quantities. For example, a mathematical relationship or mathematical transformation may express a relationship by which a quantity is derived from one or more other quantities by way of various mathematical operations, such as addition, subtraction, multiplication, division, etc. Or, a mathematical relationship may indicate that a quantity is larger, smaller, or equal to another quantity. These relationships and transformations are in practice not satisfied exactly, and should therefore be interpreted as "designed for" relationships and transformations. One of ordinary skill in the art may design various working embodiments to satisfy various mathematical relationships or transformations, but these relationships or transformations can only be met within the tolerances of the technology available to the practitioner.

Accordingly, in the following claims, it is to be understood that claimed mathematical relationships or transformations can in practice only be met within the tolerances or precision of the technology available to the practitioner, and that the scope of the claimed subject matter includes those embodiments that substantially satisfy the mathematical relationships or transformations so claimed.

What is claimed is:

1. A circuit comprising:
   a node having a node voltage;
   a capacitor comprising a first terminal coupled to the node and comprising a second terminal;
   a first rail having a first voltage;
   a second rail having a second voltage;
   a state machine to control a coupling of the second terminal of the capacitor to the first rail during a first mode of the circuit, and to control a coupling of the second terminal of the capacitor to the second rail during a second mode of the circuit; and
   a phase-locked loop, the phase-locked loop comprising a tank capacitor, the tank capacitor comprising the capacitor.

2. The circuit as set forth in claim 1, wherein the first rail comprises a ground rail having a ground voltage and the second rail comprises a voltage reference supply having a supply voltage greater than the ground voltage.

3. A circuit comprising:
   a node having a node voltage;
   a first rail having a first voltage;
   a second rail having a second voltage;
   a plurality of capacitors, each comprising a first terminal and a second terminal, where the first terminal of each capacitor is coupled to the node;
   a state machine to control a coupling of the second terminal of each capacitor to the first rail during a first mode of the circuit, and during a second mode of the circuit to control a coupling of the second terminals of a set of the plurality of capacitors to the second rail such that the node voltage is closer to the second voltage than when the state machine is in the first mode; and
   a phase-locked circuit comprising a tank capacitor, the tank capacitor comprising the plurality of capacitors.

4. The circuit as set forth in claim 3, wherein the set of plurality of capacitors is included in the plurality of capacitors.

5. The circuit as set forth in claim 3, wherein the first rail is a ground rail and the second rail is a voltage reference supply.

6. The circuit as set forth in claim 3, the state machine to bring the node voltage to the second voltage during a third mode of the circuit.

7. The circuit as set forth in claim 6, the state machine to float the node and to control a coupling of the second terminals of the plurality of capacitors to the first rail during a restore mode.

8. A circuit comprising:
   a node having a node voltage;
   a capacitor comprising a first terminal coupled to the node and comprising a second terminal;
   a first rail having a first voltage;
   a second rail having a second voltage;
   a state machine to control a coupling of the second terminal of the capacitor to the first rail during a first mode of the circuit, and to control a coupling of the second terminal of the capacitor to the second rail during a second mode of the circuit;
   a comparator to compare the node voltage to the second voltage to provide a first output voltage if the node voltage and the second voltage satisfy a first relationship between a value of the node voltage and a value of the second voltage and to provide a second output voltage if the node voltage and the second voltage satisfy a second relationship between the value of node voltage and the value of second voltage;

a second capacitor comprising a first terminal coupled to the node and a second terminal, the state machine to control a coupling of the second terminal of the second capacitor to the second rail during the second mode only if, after coupling the second terminal of the capacitor to the second rail but before the second terminal of the second capacitor is coupled to the second rail, the comparator provides the first output voltage; and a phase-locked loop, the phase-locked loop comprising a tank capacitor, the tank capacitor comprising the capacitor and the second capacitor.

9. The circuit as set forth in claim 8, wherein the first relationship is satisfied if the node voltage is less than the second voltage.

10. The circuit as set forth in claim 8, the state machine to bring the node voltage to the second voltage during a third mode of the circuit.

11. The circuit as set forth in claim 10, the state machine to float the node and to control a coupling of the second terminals of the first and second capacitors to the first rail during a restore mode.

12. A circuit comprising:
a node having a node voltage;
a capacitor comprising a first terminal coupled to the node and comprising a second terminal;
a first rail having a first voltage;
a second rail having a second voltage;
a state machine to control a coupling of the second terminal of the capacitor to the first rail during a first mode of the circuit, and to control a coupling of the second terminal of the capacitor to the second rail during a second mode of the circuit;
a comparator to compare the node voltage to the second voltage to provide a first output voltage if the node voltage and the second voltage satisfy a first relationship between a value of the node voltage and a value of the second voltage and to provide a second output voltage if the node voltage and the second voltage satisfy a second relationship between a value of the node voltage and a value of the second voltage;
the state machine coupled to the comparator to, during the second mode, de-couple the second terminal of the capacitor from the second rail and to couple the second terminal of the capacitor to the first rail if after coupling the second terminal of the capacitor to the second rail the comparator provides the second output voltage; and
a phase-locked loop, the phase-locked loop comprising a tank capacitor, the tank capacitor comprising the capacitor.

13. The circuit as set forth in claim 12, wherein the second relationship is satisfied if the node voltage is greater than the second voltage.

14. The circuit as set forth in claim 12, further comprising:
a second capacitor comprising a first terminal coupled to the node and a second terminal;
the state machine to, during the second mode, couple the second terminal of the second capacitor to the second rail.

15. The circuit as set forth in claim 12, the state machine to bring the node voltage to the second voltage during a third mode of the circuit.

16. The circuit as set forth in claim 15, the state machine to float the node and to couple the second terminals of the first and second capacitors to the first rail during a restore mode.

17. The circuit as set forth in claim 14, the state machine to, during the second mode, de-couple the second terminal of the second capacitor from the second rail and to couple the second terminal of the second capacitor to the first rail if, after coupling the second terminal of the second capacitor to the second rail during the second mode the comparator provides the second output voltage.

18. A computer system comprising:
a microprocessor;
system memory coupled to the microprocessor; and
a circuit comprising:
  a node having a node voltage;
  a first rail having a first voltage;
  a second rail having a second voltage;
  a plurality of capacitors, each comprising a first terminal and a second terminal, where the first terminal of each capacitor is coupled to the node;
  a state machine to control a coupling of the second terminal of each capacitor to the first rail during a first mode of the circuit, and during a second mode of the circuit to control a coupling of the second terminals of a set of the plurality of capacitors to the second rail such that the node voltage is closer to the second voltage than when the state machine is in the first mode; and
  a phase-locked loop comprising a tank circuit, the tank circuit comprising the plurality of capacitors.

19. The system as set forth in claim 18, wherein the set of plurality of capacitors is a proper subset of the plurality of capacitors.

20. The system as set forth in claim 18, wherein the first rail is a ground rail and the second rail is a voltage reference supply.

21. The system as set forth in claim 18, the state machine to bring the node voltage to the second voltage during a power-down mode.

22. The system as set forth in claim 18, the state machine to float the node and to control a coupling the second terminals of the plurality of capacitors to the first rail during a restore mode.

* * * * *